(12) United States Patent
Jung et al.

(10) Patent No.: US 9,853,231 B2
(45) Date of Patent: Dec. 26, 2017

(54) ORGANIC LIGHT EMITTING DISPLAY DEVICE FOR ENHANCING EFFICIENCY

(71) Applicant: LG Display Co., Ltd., Seoul (KR)

(72) Inventors: YoungKwan Jung, Paju-si (KR); Heedong Choi, Uiwang-si (KR); Seunghyun Kim, Gwangju (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 15/152,190

(22) Filed: May 11, 2016

(65) Prior Publication Data
US 2017/0062750 A1    Mar. 2, 2017

(30) Foreign Application Priority Data
Aug. 25, 2015 (KR) .................. 10-2015-0119759

(51) Int. Cl.
| | | |
|---|---|---|
| H01L 29/08 | (2006.01) | |
| H01L 21/00 | (2006.01) | |
| H01L 51/50 | (2006.01) | |
| H01L 51/52 | (2006.01) | |
| H01L 27/32 | (2006.01) | |
| H01L 27/12 | (2006.01) | |
| H01L 51/00 | (2006.01) | |

(52) U.S. Cl.
CPC ........ *H01L 51/504* (2013.01); *H01L 51/5004* (2013.01); *H01L 51/5016* (2013.01); *H01L 51/5278* (2013.01); H01L 27/1214 (2013.01); H01L 27/3246 (2013.01); H01L 27/3248 (2013.01); H01L 27/3258 (2013.01); H01L 27/3262 (2013.01); H01L 51/0061 (2013.01); H01L 51/0072 (2013.01); H01L 51/5056 (2013.01); H01L 51/5096 (2013.01); H01L 2251/5376 (2013.01); H01L 2251/552 (2013.01); H01L 2251/558 (2013.01)

(58) Field of Classification Search
CPC ............... H01L 51/504; H01L 51/5056; H01L 51/5096; H01L 51/5072; H01L 51/5278; H01L 51/5004; H01L 51/5016
See application file for complete search history.

(56) References Cited

U.S. PATENT DOCUMENTS

| | | | | |
|---|---|---|---|---|
| 7,842,406 B2* | 11/2010 | Huo | ................... | H01L 51/0061 257/40 |
| 9,431,626 B2* | 8/2016 | Kam | ................... | H01L 51/5088 |
| 9,444,066 B2* | 9/2016 | Ahn | ................... | H01L 51/5044 |
| 2007/0164278 A1* | 7/2007 | Lee | ................... | H01L 51/5036 257/40 |
| 2007/0257609 A1* | 11/2007 | Fukuda | ............... | H01L 51/5284 313/506 |
| 2013/0273678 A1* | 10/2013 | Deus | ................... | H01L 51/5265 438/35 |

(Continued)

*Primary Examiner* — Alonzo Chambliss
(74) *Attorney, Agent, or Firm* — Fenwick & West LLP

(57) ABSTRACT

Disclosed is an organic light emitting display device. The organic light emitting display device includes a first emission part between a first electrode and a second electrode and a second emission part on the first emission part. The first emission part includes a first hole transport layer and a first emission layer, and the second emission part includes a second hole transport layer and a second emission layer. A thickness of the second hole transport layer is greater than a thickness of the first hole transport layer.

24 Claims, 4 Drawing Sheets

(56) References Cited

U.S. PATENT DOCUMENTS

| | | | | |
|---|---|---|---|---|
| 2014/0183494 A1* | 7/2014 | Kam | ............... | H01L 51/5088 257/40 |
| 2014/0183496 A1* | 7/2014 | Heo | ............... | H01L 27/3209 257/40 |
| 2015/0034923 A1* | 2/2015 | Kim | ............... | H01L 51/5044 257/40 |
| 2015/0144926 A1* | 5/2015 | Lee | ............... | H01L 51/5265 257/40 |
| 2015/0188075 A1* | 7/2015 | Kim | ............... | H01L 51/5064 257/40 |
| 2015/0280161 A1* | 10/2015 | Song | ............... | H01L 51/504 257/40 |
| 2015/0280162 A1* | 10/2015 | Yoon | ............... | B82Y 10/00 257/40 |
| 2015/0340635 A1* | 11/2015 | Ahn | ............... | H01L 51/504 257/40 |
| 2016/0155976 A1* | 6/2016 | Kim | ............... | H01L 51/5044 257/40 |
| 2016/0164042 A1* | 6/2016 | Cho | ............... | H01L 51/5044 257/40 |
| 2016/0307970 A1* | 10/2016 | Kam | ............... | H01L 51/5088 |

* cited by examiner

| 104 |
| 116 |
| 114 |
| 113 |
| 112 |
| 102 |
| 101 |

ORGANIC LIGHT EMITTING DISPLAY DEVICE FOR ENHANCING EFFICIENCY

CROSS-REFERENCE TO RELATED APPLICATIONS

This application claims the benefit of the Korean Patent Application No. 10-2015-0119759 filed on Aug. 25, 2015, which is hereby incorporated by reference as if fully set forth herein.

BACKGROUND

Field

The present disclosure relates to an organic light emitting display device, and more particularly, to an organic light emitting display device for enhancing efficiency and reducing a driving voltage.

Discussion of the Related Art

Recently, as society advances to the information-oriented society, the field of display devices which visually express an electrical information signal is rapidly advancing. Various display devices, having excellent performance in terms of thinness, lightness, and low power consumption, are being developed correspondingly.

Examples of the display devices include liquid crystal display (LCD) devices, plasma display panel (PDP) devices, field emission display (FED) devices, organic light emitting display devices, etc.

Particularly, the organic light emitting display devices are self-emitting devices. In comparison with other display devices, the organic light emitting display devices have a fast response time, high emission efficiency, high luminance, and a wide viewing angle and thus are attracting much attention.

SUMMARY

Accordingly, the present disclosure is directed to provide an organic light emitting display device that substantially obviates one or more problems due to limitations and disadvantages of the related art.

In an organic light emitting device included in an organic light emitting display device, an electron and a hole are injected from two electrodes into an organic emission layer, and an exciton is generated by combining the electron with the hole. The organic light emitting device is a device using the principle that light is emitted when the generated exciton is dropped from an excited state to a ground state.

Organic light emitting devices may be categorized into a single layer emission structure and a multilayer emission structure. In the multilayer emission structure, two or more emission parts may be provided between two electrodes and may each include a hole injection layer, a hole transport layer, an emission layer, an electron transport layer, and an electron injection layer. The emission layer may use a fluorescence emission layer and phosphorescence emission layer. The fluorescence emission layer may use the principle that light is emitted when an exciton is dropped from a singlet excited state to a ground state, and the phosphorescence emission layer may use the principle that light is emitted when the exciton is dropped from a triplet excited state to the ground state. Therefore, the fluorescence emission layer may generate a singlet exciton, and for this reason, the fluorescence emission layer is not excellent in efficiency in comparison with the phosphorescence emission layer generating a triplet exciton. Therefore, a method where an exciton generated by a combination of an electron and a hole is confined to an emission layer may be used for enhancing efficiency of the fluorescence emission layer. To this end, the hole transport layer having high triplet energy level (T1) may be used.

However, a material having high triplet energy level (T1) is lower in hole mobility than a material having low triplet energy level (T1), causing an increase in a driving voltage. Also, a hole of the hole transport layer cannot move to the emission layer due to low hole mobility, and for this reason, there is a problem that a recombination area where an electron and a hole are recombined is formed in an interface between the hole transport layer and the emission layer.

Therefore, the inventors recognize the above-described problems and have done various experiments for improving efficiency of an organic light emitting display device by adjusting the thickness or triplet energy level of each of organic layers configuring the organic light emitting display device. Also, the inventors have done various experiments where in a process of forming an organic layer having high triplet energy level, a thickness of the organic layer is adjusted so as not to increase a driving voltage. Through the various experiments, the inventors have invented a new organic light emitting display device in which the thickness or triplet energy level of each of organic layers is adjusted for enhancing efficiency of the organic light emitting display device and reducing a driving voltage.

An aspect of the present disclosure is directed to provide an organic light emitting display device for enhancing efficiency and reducing a driving voltage.

Another aspect of the present disclosure is directed to provide an organic light emitting display device for preventing a driving voltage from increasing due to an organic layer having high triplet energy level.

The objects of the present disclosure are not limited to the aforesaid, but other objects not described herein will be clearly understood by those skilled in the art from descriptions below.

Additional advantages and features of the disclosure will be set forth in part in the description which follows and in part will become apparent to those having ordinary skill in the art upon examination of the following or may be learned from practice of the disclosure. The objectives and other advantages of the disclosure may be realized and attained by the structure particularly pointed out in the written description and claims hereof as well as the appended drawings.

To achieve these and other advantages and in accordance with the purpose of the disclosure, as embodied and broadly described herein, there is provided an organic light emitting display device that includes a first emission part between a first electrode and a second electrode, the first emission part including a first hole transport layer and a first emission layer, and a second emission part on the first emission part, the second emission part including a second hole transport layer and a second emission layer, wherein a thickness of the second hole transport layer is greater than a thickness of the first hole transport layer.

The thickness of the first hole transport layer may be 20 nm or less.

The first emission part may further include an electron blocking layer.

A thickness of the electron blocking layer may be greater than the thickness of the first hole transport layer, for enhancing efficiency of the first emission layer, the thickness of the electron blocking layer being within a particular range that results in enhanced efficiency of the first emission layer in comparison with a conventional electron blocking layer having a thickness outside of the particular range.

A sum of the thickness of the first hole transport layer and a thickness of the electron blocking layer may be 40 nm or less.

The first hole transport layer and the electron blocking layer may be formed of a same material.

A triplet energy level of the electron blocking layer may be within a range of 2.7 eV to 2.9 eV.

The first emission layer may include one among a blue emission layer, a deep blue emission layer, and a sky blue emission layer.

A triplet energy level of the electron blocking layer may be greater than a triplet energy level of the first hole transport layer, and a thickness of the electron blocking layer is 30 nm or less.

The organic light emitting display device may further include a third emission part on the second emission part, the third emission part including a third hole transport layer and a third emission layer.

A thickness of the third hole transport layer may be less than a thickness of the second hole transport layer.

At least one among the first hole transport layer and the third hole transport layer may include a material having a triplet energy level within a same range as a range of a triplet energy level of the electron blocking layer.

When the third hole transport layer may include a material having a triplet energy level within the same range as a range of a triplet energy level of the electron blocking layer of the first emission part, a thickness of the electron blocking layer in the first emission part is less than a thickness of the first hole transport layer.

The third emission layer may include one among a blue emission layer, a deep blue emission layer, and a sky blue emission layer.

At least one among the first emission layer and the third emission layer may include one among a blue emission layer, a deep blue emission layer, and a sky blue emission layer.

At least one among the first electrode and the second electrode may include a semitransmissive electrode.

In another aspect of the present disclosure, there is provided an organic light emitting display device that includes a first emission part between a first electrode and a second electrode, the first emission part including a first hole transport layer, an electron blocking layer, and a first emission layer, and a second emission part on the first emission part, the second emission part including a second hole transport layer and a second emission layer, wherein a thickness of the first hole transport layer is less than a thickness of the electron blocking layer.

A sum of the thickness of the first hole transport layer and the thickness of the electron blocking layer may be 40 nm or less.

A triplet energy level of the electron blocking layer may be higher than a triplet energy level of the first hole transport layer.

The first hole transport layer and the electron blocking layer may be formed of a same material.

The organic light emitting display device may further include a third emission part on the second emission part, the third emission part including a third hole transport layer and a third emission layer.

At least one among the first hole transport layer and the third hole transport layer may include a material having a triplet energy level within a same range as a range of a triplet energy level of the electron blocking layer.

The first emission layer and the third emission layer may each include one among a blue emission layer, a deep blue emission layer, and a sky blue emission layer.

Details of embodiments are included in a detailed description and the drawings.

It is to be understood that both the foregoing general description and the following detailed description of the present disclosure are exemplary and explanatory and are intended to provide further explanation of the disclosure as claimed.

BRIEF DESCRIPTION OF THE DRAWINGS

The accompanying drawings, which are included to provide a further understanding of the disclosure and are incorporated in and constitute a part of this application, illustrate embodiments of the disclosure and together with the description serve to explain the principle of the disclosure. In the drawings:

FIG. 1 is a diagram illustrating an organic light emitting device according to an embodiment of the present disclosure;

DETAILED DESCRIPTION OF THE PREFERRED EMBODIMENT

Figure 2:
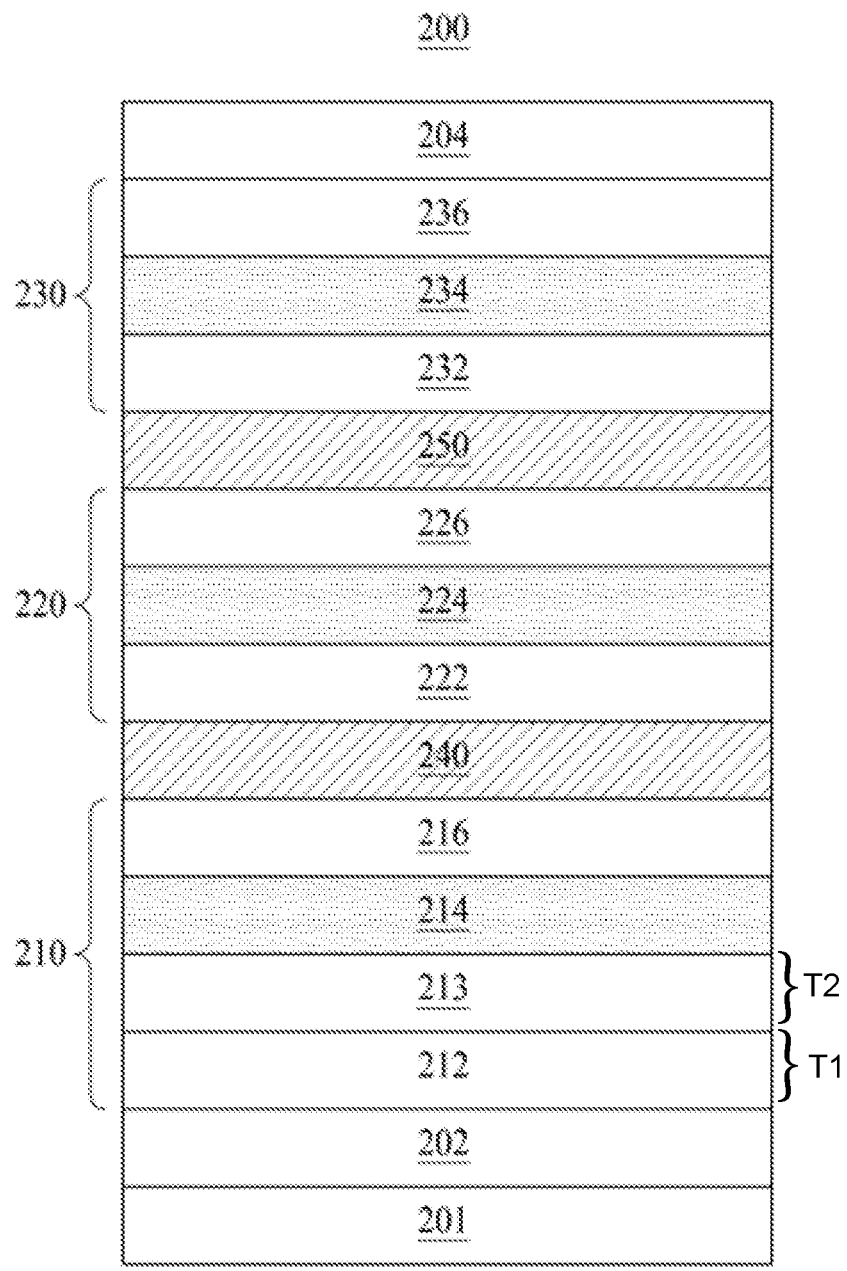
FIG. 2 is a diagram illustrating an organic light emitting device according to another embodiment of the present disclosure.

Reference will now be made in detail to the exemplary embodiments of the present disclosure, examples of which are illustrated in the accompanying drawings. Wherever possible, the same reference numbers will be used throughout the drawings to refer to the same or like parts.

Advantages and features of the present disclosure, and implementation methods thereof will be clarified through following embodiments described with reference to the accompanying drawings. The present disclosure may, however, be embodied in different forms and should not be construed as limited to the embodiments set forth herein. Rather, these embodiments are provided so that this disclosure will be thorough and complete, and will fully convey the scope of the present disclosure to those skilled in the art. Further, the present disclosure is only defined by scopes of claims.

A shape, a size, a ratio, an angle, and a number disclosed in the drawings for describing embodiments of the present disclosure are merely an example, and thus, the present disclosure is not limited to the illustrated details. Like reference numerals refer to like elements throughout. In the following description, when the detailed description of the relevant known function or configuration is determined to unnecessarily obscure the important point of the present disclosure, the detailed description will be omitted. In a case where "comprise", "have", and "include" described in the present specification are used, another part may be added unless "only" is used. The terms of a singular form may include plural forms unless referred to the contrary.

In construing an element, the element is construed as including an error range although there is no explicit description.

In describing a position relationship, for example, when a position relation between two parts is described as "on", "over", "under", and "next", one or more other parts may be disposed between the two parts unless "just" or "direct" is used.

In describing a time relationship, for example, when the temporal order is described as "after", "subsequent", "next", and "before", a case which is not continuous may be included unless "just" or "direct" is used.

It will be understood that, although the terms "first", "second", etc. may be used herein to describe various elements, these elements should not be limited by these terms. These terms are only used to distinguish one element from another. For example, a first element could be termed a second element, and, similarly, a second element could be termed a first element, without departing from the scope of the present disclosure.

Features of various embodiments of the present disclosure may be partially or overall coupled to or combined with each other, and may be variously inter-operated with each other and driven technically as those skilled in the art can sufficiently understand. The embodiments of the present disclosure may be carried out independently from each other, or may be carried out together in co-dependent relationship.

Hereinafter, embodiments of the present disclosure will be described in detail with reference to the accompanying drawings.

Figure 1:
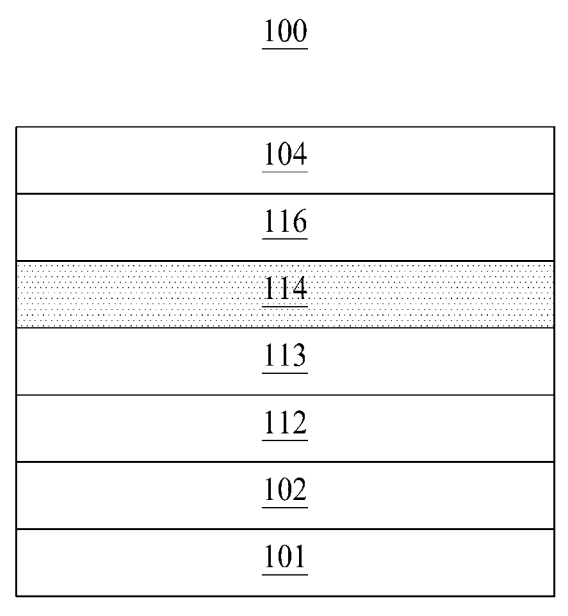

FIG. 1 is a diagram illustrating an organic light emitting device 100 according to an embodiment of the present disclosure.

The organic light emitting device 100 according to an embodiment of the present disclosure illustrated in FIG. 1 may include a substrate 101, first and second electrodes 102 and 104, a hole transport layer (HTL) 112, an electron blocking layer (EBL) 113, an emission layer (EML) 114, and an electron transport layer (ETL) 116. Here, the HTL 112, the EBL 113, the emission layer 114, and the ETL 116 may be disposed between the first and second electrodes 102 and 104.

The emission layer 114 may be provided as a blue emission layer. The EBL 113 may be provided between the HTL 112 and the emission layer 114, for enhancing efficiency of the blue emission layer. The EBL 113 prevents an electron, injected into the emission layer 114, from being transferred to the HTL 112 and thus enhances a combination of the electron and a hole in the emission layer 114, thereby enhancing the emission efficiency of the emission layer 114. The EBL 113 may be formed of a material higher in a triplet energy level (T1) than the emission layer 114, thereby preventing a movement of the electron injected into the emission layer 114. A material having high a triplet energy level (T1) is lower in hole mobility than a material having low triplet energy level, causing an increase in a driving voltage. The EBL 113 may be formed thinner than the HTL 112, for lowering the driving voltage. Therefore, in a bottom emission type display device including the organic light emitting device of FIG. 1 which transmits light emitted from the emission layer 114 to the first electrode 102, a thickness of the HTL 112 may be thick, and thus, the EBL 113 may be formed to have a thin thickness.

Moreover, in a top emission type display device where the light emitted from the emission layer 114 is transmitted to the second electrode 104, an optical path is opposite to that of the bottom emission type display device, and thus, a thickness of the HTL 112 may be thin. The EBL 113 having high triplet energy level may be formed thicker than the HTL 112, causing an increase in the driving voltage.

Therefore, the inventors have invented a new organic light emitting display device in which a thickness of an HTL is minimized, a thickness of an EBL is thick, an exciton confinement effect of an emission layer is maximized, efficiency of the emission layer is enhanced, and a driving voltage does not increase.

This will be described with reference to FIG. 2.

An organic light emitting device 200 according to another embodiment of the present disclosure illustrated in FIG. 2 may include a substrate 201, first and second electrodes 202 and 204, and first to third emission parts 210 to 230 between the first and second electrodes 202 and 204.

The substrate 201 may be formed of an insulating material or a material having flexibility. The substrate 201 may be formed of glass, metal, or plastic, but is not limited thereto. When an organic light emitting display device is a flexible organic light emitting display device, the substrate 101 may be formed of a flexible material such as plastic.

The first electrode 202 may be an anode supplying a hole and may be formed of indium tin oxide (ITO) or indium zinc oxide (IZO) which is a transparent conductive material such as transparent conductive oxide (TCO), but is not limited thereto. Alternatively, the first electrode 202 may be formed of gold (Au), silver (Ag), aluminum (Al), molybdenum (Mo), magnesium (Mg), Lithium (Li), calcium (Ca), lithium fluoride (LiF), Ag:Mg, ITO, or IZO, may be formed of an alloy thereof, or may be formed of a single layer or a multilayer thereof. However, the present embodiment is not limited thereto. Also, a reflective electrode may be further formed under the first electrode 202 and may reflect light toward the second electrode 204.

The second electrode 204 may be a cathode supplying an electron. The second electrode 204 may be formed of Au, Ag, Al, Mo, Mg, Li, Ca, LiF, or Ag:Mg which is a metal material, may be formed of ITO, IZO, or indium gallium zinc oxide (IGZO) which is a transparent conductive material such as TCO, or may be formed of a single layer or a multilayer thereof. However, the present embodiment is not limited thereto. Also, a buffer layer may be further formed under the second electrode 204.

Each of the first electrode 202 and the second electrode 204 may be referred to as an anode or a cathode. Alternatively, the first electrode 202 may be formed as a transmissive electrode, and the second electrode 204 may be formed as a semitransmissive electrode. Alternatively, the first electrode 202 may be formed as a reflective electrode, and the second electrode 204 may be formed as a semitransmissive electrode. Alternatively, the first electrode 202 may be formed as a semitransmissive electrode, and the second electrode 204 may be formed as a transmissive electrode. Alternatively, at least one among the first and second electrodes 202 and 204 may be formed as a semitransmissive electrode.

The first emission part 210 may include a first HTL 212, an EBL 213, a first EML 214, and a first ETL 216 which are disposed on the first electrode 202.

A hole injection layer (HIL) may be further formed on the first electrode 202. The HIL enables a hole, supplied from the first electrode 202, to be smoothly injected into the first HTL 212.

The first HTL 212 may supply a hole, supplied from the HIL, to the first EML 214. The first ETL 216 may supply an electron, supplied from the second electrode 204, to the first EML 214. Therefore, a hole supplied through the first HTL 212 and an electron supplied through the first ETL 216 may be recombined in the first EML 214 to emit light.

The first ETL 216 may be formed of two or more layers or two or more materials. An electron injection layer (EIL) may be further formed on the first ETL 216.

The EBL 213 may be formed on the first HTL 212, for enhancing efficiency of the first EML 214.

In a bottom emission type display device, the first HTL 212 included in the first emission part 210 may be formed to have a thick thickness, thereby enhancing efficiency of the first EML 214 included in the first emission part 210. The organic light emitting display device according to the present embodiment is a top emission type display device where light emitted from the emission layer is transmitted to the second electrode, and thus, an optical path is opposite to that of the bottom emission type display device. Accordingly, a thickness of the first HTL 212 included in the first emission part 210 may be thin, and thus, a thickness of the EBL 213 may be thick for enhancing efficiency of the first EML 214 included in the first emission part 210. That is, according to the present embodiment, a thickness of the first HTL 212 is minimized, a thickness of the EBL 213 is thick, and an exciton confinement effect of the first EML 214 is maximized, thereby enhancing efficiency of the emission layer. Also, according to the present embodiment, a thickness of the EBL 213 may be adjusted for solving a problem that a driving voltage increases when the EBL 213 is formed to have high triplet energy level (T1). Also, according to the present embodiment, an organic light emitting display device may be manufactured by using the same materials or organic layers as materials or organic layers of the bottom emission type display device, and thus, a manufacturing process of the bottom emission type display device may be shared, thereby reducing the manufacturing cost.

According to the present embodiment, the triplet energy level (T1) of the EBL 213 may be higher than that of the first HTL 212, for enhancing efficiency of the first EML 214. The triplet energy level (T1) of the EBL 213 may be 2.7 eV or more, and may be within a range of 2.7 eV to 2.9 eV. Also, a thickness of the EBL 213 having high triplet energy level may be adjusted to 30 nm or less, thereby solving a problem where the driving voltage increases due to the high triplet energy level.

Moreover, since a thickness of the EBL 213 is greater than that of the first HTL 212, a combination of a hole and an electron in the first EML 214 is enhanced, and thus, the exciton confinement effect of the first EML 214 increases, thereby enhancing efficiency of the first EML 214. For example, a thickness of the EBL 213 may be 30 nm or less. Also, the first HTL 212 may be formed to have a thin thickness in consideration of efficiency of the first EML 214. Accordingly, a sum of a thickness of the EBL 213 and a thickness of the first HTL 212 may be 40 nm or less.

Moreover, the first HTL 212 and the EBL 213 may be provided as the EBL 213 which is a single layer. Alternatively, the first HTL 212 and the EBL 213 may be formed of the same material. Accordingly, one among the first HTL 212 and the EBL 213 may be removed, thereby reducing the manufacturing cost.

The first EML 214 may be an emission layer emitting light having a first color. That is, the first EML 214 may include one among a blue emission layer, a deep blue emission layer, and a sky blue emission layer. An emission area of the first EML 214 may be within a range of 440 nm to 480 nm.

The first EML 214 may be formed of a blue emission layer which includes an auxiliary emission layer emitting light having a color different from that of light emitted from the blue emission layer. The auxiliary emission layer may be configured with one among a yellow-green emission layer and a red emission layer, or may be configured by a combination thereof. When the auxiliary emission layer is further provided, green or red efficiency can be further improved. When the first EML 214 is provided along with the auxiliary emission layer, the yellow-green emission layer, the red emission layer, or a green emission layer may be disposed on or under the blue emission layer. Also, the yellow-green emission layer, the red emission layer, or the green emission layer may be identically or differently provided as the auxiliary emission layer on and under the blue emission layer. The positions or number of emission layers may be selectively determined depending on a structure and a characteristic of a device, but the present embodiment is not limited thereto.

When the first EML 214 includes the yellow-green emission layer which is the auxiliary emission layer, an emission area of the first EML 214 may be within a range of 440 nm to 590 nm. Also, when the first EML 214 includes the red emission layer which is the auxiliary emission layer, the emission area of the first EML 214 may be within a range of 440 nm to 650 nm. Also, when the first EML 214 includes the yellow-green emission layer and the red emission layer which configure the auxiliary emission layer, the emission area of the first EML 214 may be within a range of 440 nm to 650 nm. Therefore, the first EML 214 may include one among a blue emission layer, a deep blue emission layer, a sky blue emission layer, a combination of a red emission layer and one among a blue emission layer, a deep blue emission layer and a sky blue emission layer, and a combination of a yellow-green emission layer and one among a blue emission layer, a deep blue emission layer and a sky blue emission layer.

The first EML 214 may include at least one host and dopant. Alternatively, the first EML 214 may include a mixed host, where two or more hosts are mixed, and at least one dopant. The mixed host may include a host having hole-transporting characteristic and a host having electron-transporting characteristic. When the first EML 214 is formed of the mixed host, a charge balance of the emission layer may be adjusted, thereby enhancing efficiency of the emission layer. Also, the dopant may be a fluorescent dopant or a phosphorescent dopant.

The second emission part 220 may include a second HTL 222, a second EML 224, and a second ETL 226 which are disposed on the first emission part 210.

An EIL may be further formed on the second ETL 226. Also, an HIL may be further formed under the second HTL 222.

An EBL may be further formed under the second EML 224. The EBL prevents an electron, injected into the second EML 224, from being transferred to the second HTL 222 and thus enhances a combination of an electron and a hole in the second EML 224, thereby enhancing the emission efficiency of the second EML 224. The second HTL 222 and the EBL may be provided as one layer.

The second EML 224 may be an emission layer emitting light having a second color. That is, the second EML 224 may include one among a yellow-green emission layer, a green emission layer, a yellow-green emission layer and a red emission layer, a yellow emission layer and a red emission layer, and a green emission layer and a red emission layer. When the second EML 224 includes the yellow-green emission layer, an emission area of the second EML 224 may be within a range of 510 nm to 590 nm. Also, when the second EML 224 includes the green emission layer, the emission area of the second EML 224 may be within a range of 510 nm to 580 nm. Also, when the second EML 224 includes the yellow-green emission layer and the red emission layer, the emission area of the second EML 224 may be within a range of 510 nm to 650 nm. Also, when the second EML 224 includes the yellow emission layer and the red emission layer, the emission area of the second EML 224 may be within a range of 540 nm to 650 nm. Also, when the second EML 224 includes the green emission layer and the red emission layer, the emission area of the second EML 224 may be within a range of 510 nm to 650 nm.

The second EML 224 may include at least one host and dopant. Alternatively, the second EML 224 may include a mixed host, where two or more hosts are mixed, and at least one dopant. The mixed host may include a host having hole-transporting characteristic and a host having electron-transporting characteristic. When the second EML 224 is formed of the mixed host, a charge balance of the emission layer may be adjusted, thereby enhancing efficiency of the emission layer. Also, the dopant may be a fluorescent dopant or a phosphorescent dopant.

A first charge generation layer (CGL) 240 may be further provided between the first emission part 210 and the second emission part 220. The first CGL 240 may adjust a balance of electrical charges between the first emission part 210 and the second emission part 220.

The first CGL 240 may include an N-type CGL and a P-type CGL. The N-type CGL may inject an electron into the first emission part 210. The N-type CGL may be formed as an organic layer which is doped with alkali metal such as lithium (Li), sodium (Na), potassium (K), or cesium (Cs) or alkali earth metal such as magnesium (Mg), strontium (Sr), barium (Ba), or radium (Ra), but is not limited thereto.

The P-type CGL may inject a hole into the second emission part 220. The P-type CGL may be formed as an organic layer including a P-type dopant, but is not limited thereto.

The third emission part 230 may include a third HTL 232, a third EML 234, and a third ETL 236 which are disposed on the second emission part 230.

An EIL may be further formed on the third ETL 236. Also, an HIL may be further formed under the third HTL 232.

The third EML 234 may be an emission layer emitting light having the same color as the first color. That is, the third EML 234 may include one among a blue emission layer, a deep blue emission layer, and a sky blue emission layer. An emission area of the third EML 234 may be within a range of 440 nm to 480 nm.

The third EML 234 may be formed of a blue emission layer which includes an auxiliary emission layer emitting light having a color different from that of light emitted from the blue emission layer. The auxiliary emission layer may be configured with one among a yellow-green emission layer and a red emission layer, or may be configured by a combination thereof. When the auxiliary emission layer is further provided, green or red efficiency can be further improved. When the third EML 234 is provided along with the auxiliary emission layer, the yellow-green emission layer, the red emission layer, or a green emission layer may be disposed on or under the blue emission layer. Also, the yellow-green emission layer, the red emission layer, or the green emission layer may be identically or differently provided as the auxiliary emission layer on and under the blue emission layer. The positions or number of emission layers may be selectively determined depending on a structure and a characteristic of a device, but the present embodiment is not limited thereto. When the third EML 234 includes the auxiliary emission layer, an emission area of the third EML 234 may be within a range of 440 nm to 650 nm. Therefore, the third EML 234 may include one among a blue emission layer, a deep blue emission layer, a sky blue emission layer, a combination of a red emission layer and one among a blue emission layer, a deep blue emission layer and a sky blue emission layer, and a combination of a yellow-green emission layer and one among a red emission layer, a blue emission layer, a deep blue emission layer and a sky blue emission layer.

The third EML 234 may include at least one host and dopant. Alternatively, the third EML 234 may include a mixed host, where two or more hosts are mixed, and at least one dopant. The mixed host may include a host having hole-transporting characteristic and a host having electron-transporting characteristic. When the third EML 234 is formed of the mixed host, a charge balance of the emission layer may be adjusted, thereby enhancing efficiency of the emission layer. Also, the dopant may be a fluorescent dopant or a phosphorescent dopant.

A second CGL 250 may be further provided between the second emission part 220 and the third emission part 230. The second CGL 250 may adjust a balance of electrical charges between the second emission part 220 and the third emission part 230.

The second CGL 250 may include an N-type CGL and a P-type CGL. The N-type CGL may inject an electron into the second emission part 220, and the P-type CGL may inject a hole into the third emission part 230.

The N-type CGL may be formed as an organic layer which is doped with alkali metal such as lithium (Li), sodium (Na), potassium (K), or cesium (Cs) or alkali earth metal such as magnesium (Mg), strontium (Sr), barium (Ba), or radium (Ra), but is not limited thereto. The P-type CGL may be formed as an organic layer including a P-type dopant, but is not limited thereto.

In the organic light emitting display device including the organic light emitting device according to an embodiment of the present disclosure, a pixel area may be defined on the substrate 201 by a gate line and a data line. A power line which extends in parallel with one among the gate line and the data line may be disposed on the substrate 201, and a switching thin film transistor (TFT) connected to the gate line or the data line and a driving TFT connected to the switching TFT may be disposed in the pixel area. The driving TFT may be connected to the first electrode 202.

In an embodiment of the present disclosure, a thickness of the second HTL 222 may be greater than that of the first HTL 212, for enhancing efficiency of the first EML 214. Also, a thickness of the third HTL 232 may be less than that of the second HTL 222, for enhancing efficiency of the third EML 234. A thickness of the first HTL 212 may be 20 nm or less, and a thickness of the second HTL 222 may be 70 nm or less. Also, a thickness of the third HTL 232 may be 30 nm or less.

Moreover, in an embodiment of the present disclosure, a triplet energy level (T1) of the EBL 213 may be higher than that of the first HTL 212, for enhancing efficiency of the first EML 214. The triplet energy level (T1) of the first HTL 212 may be within a range of 2.2 eV to 2.5 eV. Also, the triplet energy level (T1) of the EBL 213 may be 2.7 eV or more. Therefore, a thickness of the EBL 213 having high triplet energy level (T1) may be adjusted to 30 nm or less, thereby solving a problem where the driving voltage increases due to the high triplet energy level. Alternatively, the first HTL 212 and the EBL 213 may be formed of the same material. Alternatively, a thickness of the EBL 213 may be greater than that of the first HTL 212, thereby maximizing the exciton confinement effect of the first EML 214. This will be described below with reference to the following Table 1.

The following Table 1 may show a result which is obtained by measuring the blue efficiency and driving voltage of a comparative example 1, the blue efficiency and driving voltage of an embodiment 1 of the present disclosure, and the blue efficiency and driving voltage of an embodiment 2 of the present disclosure.

TABLE 1

| | Comparative Example 1 | Embodiment 1 | Embodiment 2 |
|---|---|---|---|
| B Efficiency (cd/A) | 2.66 | 2.70 | 2.72 |
| Driving Voltage | 11.6 V | 11.6 V | 11.6 V |

In the comparative example 1 shown in Table 1, a thickness of the first HTL 212 is 20 nm, a thickness of the EBL 213 is 10 nm, and a thickness of the first HTL 212 is thicker than that of the EBL 213.

In the embodiment 1, a thickness of the first HTL 212 may is 10 nm, a thickness of the EBL 213 is 20 nm, and a thickness of the first HTL 212 is thinner than that of the EBL 213.

In the embodiment 2, the first HTL 212 and the EBL 213 is provided as a single layer. That is, the first HTL 212 is not provided, and only the EBL 213 is provided, and in this case, a thickness of the EBL 213 is 27 nm.

In the embodiment 1 and the embodiment 2, a triplet energy level (T1) of the first HTL 212 may be based on a material among materials having triplet energy level within a range of 2.2 eV to 2.5 eV, and triplet energy level (T1) of the EBL 213 may be based on a material among materials having triplet energy level of 2.7 eV or more. For example, the first HTL 212 may be expressed as the following Chemical Formula 1, and the EBL 213 may be expressed as the following Chemical Formula 2. Details of the present disclosure are not limited to Chemical Formula 1 or 2.

[Chemical Formula 1]

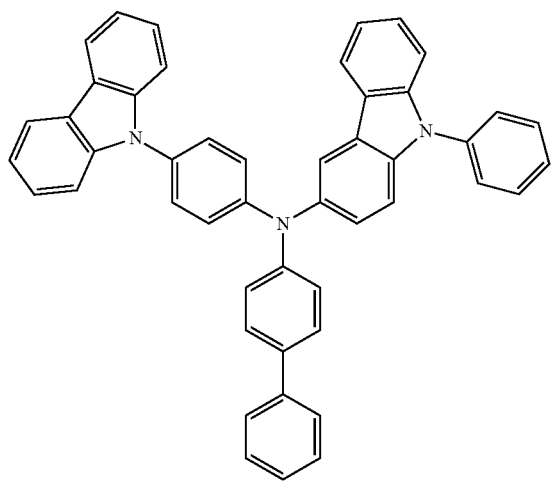

[Chemical Formula 2]

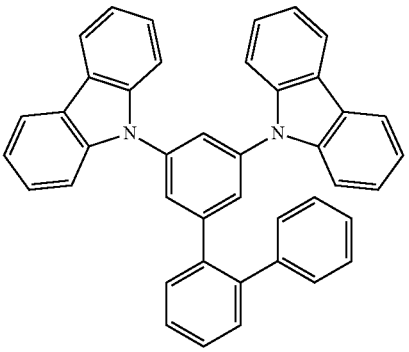

As shown in Table 1, it can be seen that blue efficiency of the comparative example 1 is 2.66 cd/A, blue efficiency of the embodiment 1 is 2.70 cd/A, and blue efficiency of the embodiment 2 is 2.72 cd/A. Therefore, in comparison with the comparative example 1, it can be seen that in the embodiments 1 and 2, a thickness of an EBL 213 is thicker than that of a first HTL 212, and thus, blue efficiency is enhanced. Also, it can be seen that blue efficiency is further enhanced in the embodiment 2, where only an EBL 213 is provided without a first HTL 212, than the embodiment 1. Accordingly, it can be seen that the exciton confinement effect of a first EML 214 is maximized by the EBL 213, and thus, blue efficiency is further enhanced.

Moreover, it can be seen that in a driving voltage (V), the comparative example 1, the embodiment 1, and the embodiment 2 are equal. That is, it can be seen that a thickness of the EBL 213 having high triplet energy level is adjusted to 30 nm or less, and thus, the driving voltage does not increase despite high triplet energy level. Also, it can be seen that even when only the EBL 213 is provided without the first HTL 212, the driving voltage does not increase despite high triplet energy level.

Therefore, according to the present embodiment, a thickness T2 of the EBL 213 may be greater than the thickness T1 of first HTL 212 so as to enhance efficiency of the first EML 214, thereby enhancing blue efficiency. And, according to the present embodiment, a thickness T2 of the EBL 213 may be greater than the thickness T1 of first HTL 212, and the thickness T2 of the EBL 213 is within a particular range that results in enhanced efficiency of the first emission layer in comparison with a conventional EBL having a thickness outside of the particular range. Also, since a thickness T2 of the EBL 213 is 30 nm or less, provided is an organic light emitting display device in which the driving voltage does not increase even when the EBL 213 is configured to have high triplet energy level.

Alternatively, according to the present embodiment, since triplet energy level (T1) of the EBL 213 adjacent to the first EML 214 is high, the exciton confinement effect of the emission layer increases, thereby enhancing the blue efficiency of the first EML 214.

Alternatively, according to the present embodiment, the blue efficiency of the first EML 214 is further enhanced in a case, where a thickness of the first HTL 212 is less than that of the EBL 213, than a case where a thickness of the first HTL 212 is greater than that of the EBL 213.

Alternatively, according to the present embodiment, since the first HTL 212 is formed as the EBL 213, provided is an organic light emitting display device in which even when the EBL 213 is configured to have high triplet energy level, the driving voltage does not increase.

Alternatively, according to the present embodiment, since the first HTL 212 and the EBL 213 are provided as a single layer, one among the first HTL 212 and the EBL 213 may be removed, thereby reducing the manufacturing cost.

Alternatively, according to the present embodiment, since the first HTL 212 and the EBL 213 are formed of the same material, one among the first HTL 212 and the EBL 213 may be removed, thereby reducing the manufacturing cost.

Alternatively, according to the present embodiment, a thickness of the first HTL 212 may be thin, and a thickness of the EBL 213 having high triplet energy level may be thick. Accordingly, the exciton confinement effect of the emission layer increases, thereby enhancing the blue efficiency of the first EML 214.

Alternatively, according to the present embodiment, since the EBL 213 having high triplet energy level is disposed adjacent to the emission layer, the exciton confinement effect of the emission layer increases, and thus, an organic layer having high triplet energy level may not additionally be provided in the first ETL 216. Accordingly, the number of organic layers is reduced, thereby reducing the manufacturing cost.

Another embodiment of the present disclosure has been described above as an embodiment where the EBL 213 is provided in the first emission part 210 to enhance efficiency of the first EML 214. However, another embodiment of the present disclosure may be an embodiment where a third HTL 232 of a third emission part includes a material of an EBL, and will be described below with reference to FIG. 3.

Figure 3:
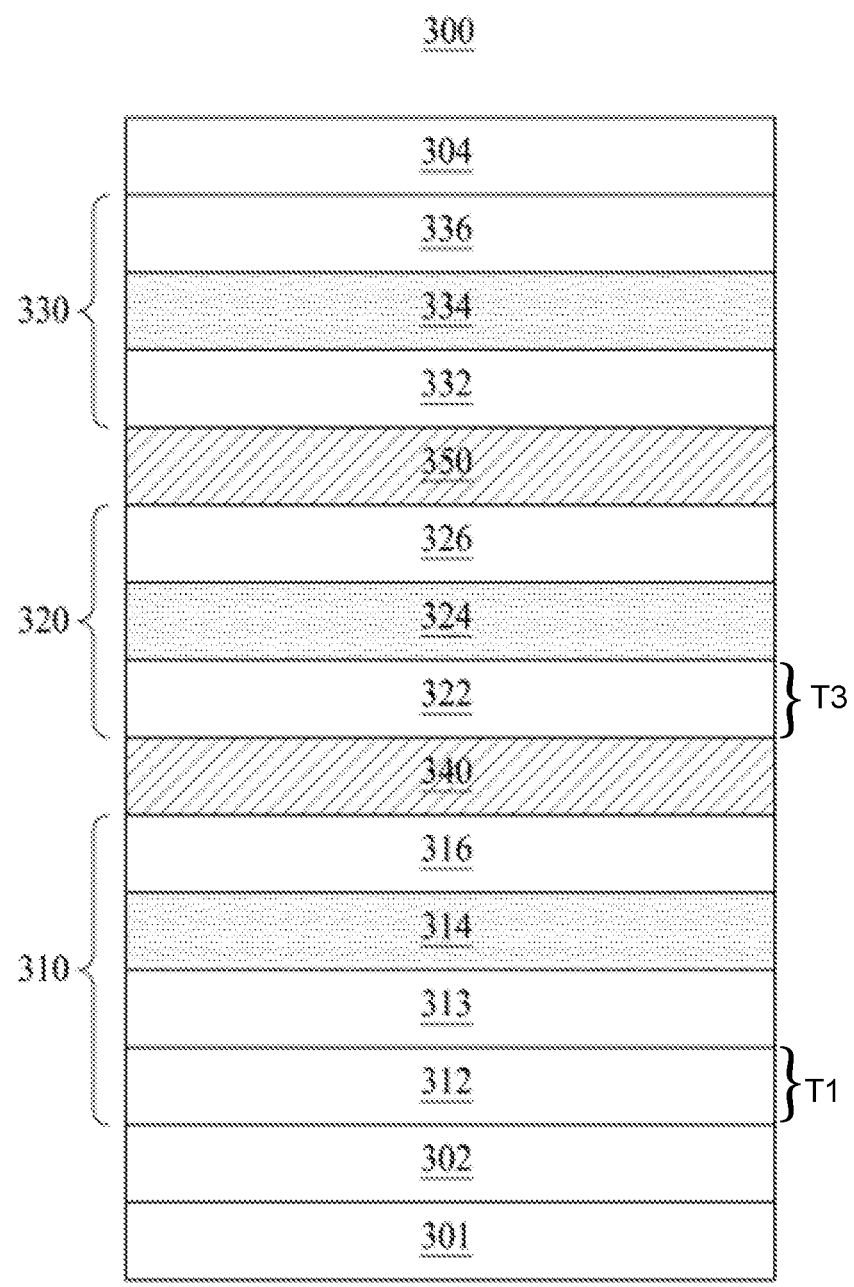
FIG. 3 is a diagram illustrating an organic light emitting device according to another embodiment of the present disclosure.

FIG. 3 is a diagram illustrating an organic light emitting device 300 according to another embodiment of the present disclosure.

The organic light emitting device 300 according to another embodiment of the present disclosure illustrated in FIG. 3 may include a substrate 301, first and second electrodes 302 and 304, and first to third emission parts 310 to 330 between the first and second electrodes 302 and 304.

The substrate 301, the first electrode 302, the second electrode 304, and the second emission part 320 illustrated in FIG. 3 may be substantially the same as the substrate 201, the first electrode 202, the second electrode 204, and the second emission part 220 illustrated in FIG. 2. Thus, detailed descriptions of the substrate 301, the first electrode 302, the second electrode 304, and the second emission part 320 are not provided.

The first emission part 310 may include a first HTL 312, an EBL 313, a first EML 314, and a first ETL 316 which are disposed on the first electrode 302.

An HIL may be further formed on the first electrode 302. An EIL may be further formed on the first ETL 316.

The EBL 313 may be formed on the first HTL 312, for enhancing efficiency of the first EML 314. And, a thickness of the EBL may be greater than that of first HTL, and the thickness of the EBL is within a particular range that results in enhanced efficiency of the first emission layer in comparison with a conventional EBL having a thickness outside of the particular range.

According to the present embodiment, a thickness of the first HTL 312 is minimized, a thickness of the EBL 313 is thick, and an exciton confinement effect of the first EML 314 is maximized, thereby enhancing efficiency of the emission layer. Also, according to the present embodiment, a thickness of the EBL 313 may be adjusted for solving a problem that a driving voltage increases when the EBL 313 is formed to have high triplet energy level (T1). Also, according to the present embodiment, an organic light emitting display device may be manufactured by using the same materials or organic layers as materials or organic layers of the bottom emission type display device, and thus, a manufacturing process of the bottom emission type display device may be shared, thereby reducing the manufacturing cost.

According to the present embodiment, the triplet energy level (T1) of the EBL 313 may be higher than that of the first HTL 312, for enhancing efficiency of the first EML 314. The triplet energy level (T1) of the EBL 313 may be 2.7 eV or more, and may be within a range of 2.7 eV to 2.9 eV. Also, a thickness of the EBL 313 having high triplet energy level may be adjusted to 30 nm or less, thereby solving a problem where the driving voltage increases due to the high triplet energy level.

Alternatively, since a thickness of the EBL 313 is greater than that of the first HTL 312, a combination of a hole and an electron in the first EML 314 is enhanced, and thus, the exciton confinement effect of the first EML 314 increases, thereby enhancing efficiency of the first EML 314. For example, a thickness of the EBL 313 may be 30 nm or less. Also, the first HTL 312 may be formed to have a thin thickness in consideration of efficiency of the first EML 314. Accordingly, a sum of a thickness of the EBL 313 and a thickness of the first HTL 312 may be 40 nm or less.

Alternatively, the first HTL 312 and the EBL 313 may be provided as the EBL 313 which is a single layer. Alternatively, the first HTL 312 and the EBL 313 may be formed of the same material. Accordingly, one among the first HTL 312 and the EBL 313 may be removed, thereby reducing the manufacturing cost.

The first EML 314 may be an emission layer emitting light having a first color. That is, the first EML 314 may include one among a blue emission layer, a deep blue emission layer, and a sky blue emission layer. An emission area of the first EML 314 may be within a range of 440 nm to 480 nm.

The first EML 314 may be formed of a blue emission layer which includes an auxiliary emission layer emitting light having a color different from that of light emitted from the blue emission layer. The auxiliary emission layer may be configured with one among a yellow-green emission layer and a red emission layer, or may be configured by a combination thereof. When the auxiliary emission layer is further provided, green or red efficiency can be further improved. When the first EML 314 is provided along with the auxiliary emission layer, the yellow-green emission layer, the red emission layer, or a green emission layer may be disposed on or under the blue emission layer. Also, the yellow-green emission layer, the red emission layer, or the green emission layer may be identically or differently provided as the auxiliary emission layer on and under the blue emission layer. The positions or number of emission layers may be selectively determined depending on a structure and a characteristic of a device, but the present embodiment is not limited thereto.

When the first EML 314 includes the yellow-green emission layer which is the auxiliary emission layer, an emission area of the first EML 314 may be within a range of 440 nm to 590 nm. Also, when the first EML 314 includes the red emission layer which is the auxiliary emission layer, the emission area of the first EML 314 may be within a range of 440 nm to 650 nm. Also, when the first EML 314 includes the yellow-green emission layer and the red emission layer which configure the auxiliary emission layer, the emission area of the first EML 314 may be within a range of 440 nm to 650 nm. Therefore, the first EML 314 may include one among a blue emission layer, a deep blue emission layer, a sky blue emission layer, a combination of a red emission layer and one among a blue emission layer, a deep blue emission layer and a sky blue emission layer, and a combination of a yellow-green emission layer and one among a blue emission layer, a deep blue emission layer and a sky blue emission layer.

The first EML 314 may include at least one host and dopant. Alternatively, the first EML 314 may include a mixed host, where two or more hosts are mixed, and at least one dopant. The mixed host may include a host having hole-transporting characteristic and a host having electron-transporting characteristic. When the first EML 314 is formed of the mixed host, a charge balance of the emission layer may be adjusted, thereby enhancing efficiency of the emission layer. Also, the dopant may be a fluorescent dopant or a phosphorescent dopant.

The second emission part 320 may include a second HTL 322, a second EML 324, and a second ETL 326 which are disposed on the first emission part 310.

A first CGL 340 may be further provided between the first emission part 310 and the second emission part 320. The first CGL 340 may adjust a balance of electrical charges between the first emission part 310 and the second emission part 320. The first CGL 340 may include an N-type CGL and a P-type CGL.

The third emission part 330 may include a third HTL 332, a third EML 334, and a third ETL 336 which are disposed on the second emission part 320.

An EIL may be further formed on the third ETL 336. Also, an HIL may be further formed under the third HTL 332.

The third EML 334 may be an emission layer emitting light having the same color as the first color. That is, the third EML 334 may include one among a blue emission layer, a deep blue emission layer, and a sky blue emission layer. An emission area of the third EML 334 may be within a range of 440 nm to 480 nm.

The third EML 334 may be formed of a blue emission layer which includes an auxiliary emission layer emitting light having a color different from that of light emitted from the blue emission layer. The auxiliary emission layer may be configured with one among a yellow-green emission layer and a red emission layer, or may be configured by a combination thereof. When the auxiliary emission layer is further provided, green or red efficiency can be further improved. When the third EML 334 is provided along with the auxiliary emission layer, the yellow-green emission layer, the red emission layer, or a green emission layer may be disposed on or under the blue emission layer. Also, the yellow-green emission layer, the red emission layer, or the green emission layer may be identically or differently provided as the auxiliary emission layer on and under the blue emission layer. The positions or number of emission layers may be selectively determined depending on a structure and a characteristic of a device, but the present embodiment is not limited thereto. When the third EML 334 includes the auxiliary emission layer, an emission area of the third EML 334 may be within a range of 440 nm to 650 nm. Therefore, the third EML 334 may include one among a blue emission layer, a deep blue emission layer, a sky blue emission layer, a combination of a red emission layer and one among a blue emission layer, a deep blue emission layer and a sky blue emission layer, and a combination of a yellow-green emission layer and one among a red emission layer, a blue emission layer, a deep blue emission layer and a sky blue emission layer.

The third EML 334 may include at least one host and dopant. Alternatively, the third EML 334 may include a mixed host, where two or more hosts are mixed, and at least one dopant. The mixed host may include a host having hole-transporting characteristic and a host having electron-transporting characteristic. When the third EML 334 is formed of the mixed host, a charge balance of the emission layer may be adjusted, thereby enhancing efficiency of the emission layer. Also, the dopant may be a fluorescent dopant or a phosphorescent dopant.

In order to enhance efficiency of the third EML 334, the third ETL 336 may be formed of a material having triplet energy level (T1) within the same range as that of the EBL 313. Accordingly, the exciton confinement effect of the third EML 334 is maximized, thereby enhancing the blue efficiency of the third EML 334. Accordingly, the blue efficiency of the first EML 314 included in the first emission part 310 and the blue efficiency of the third EML 334 included in the third emission part 330 are enhanced, thereby further enhancing the whole blue efficiency of the organic light emitting device.

A second CGL 350 may be further provided between the second emission part 320 and the third emission part 330. The second CGL 350 may adjust a balance of electrical charges between the second emission part 320 and the third emission part 330. The second CGL 350 may include an N-type CGL and a P-type CGL.

In the organic light emitting display device including the organic light emitting device according to another embodiment of the present disclosure, a pixel area may be defined on the substrate 301 by a gate line and a data line. A power line which extends in parallel with one among the gate line and the data line may be disposed on the substrate 301, and a switching thin film transistor (TFT) connected to the gate line or the data line and a driving TFT connected to the switching TFT may be disposed in the pixel area. The driving TFT may be connected to the first electrode 302.

In an embodiment of the present disclosure, a thickness T3 of the second HTL 322 may be greater than the thickness T1 of the first HTL 312, for enhancing efficiency of the first EML 314. Also, a thickness of the third HTL 332 may be less than that of the second HTL 322, for enhancing efficiency of the third EML 334. A thickness T1 of the first HTL 312 may be 20 nm or less, and a thickness T3 of the second HTL 322 may be 70 nm or less. Also, a thickness of the third HTL 332 may be 30 nm or less.

According to the present embodiment, the triplet energy level (T1) of the EBL 313 may be higher than that of the first HTL 312, for enhancing efficiency of the first EML 314. The triplet energy level (T1) of the EBL 313 may be 2.7 eV or more, and may be within a range of 2.7 eV to 2.9 eV. Also, a thickness of the EBL 313 having high triplet energy level may be adjusted to 30 nm or less, thereby solving a problem where the driving voltage increases due to the high triplet energy level. Alternatively, a thickness of the EBL 313 may be thicker than that of the first HTL 312, and thus, the exciton confinement effect of the first EML 314 is maximized. Alternatively, at least one among the first HTL 312 of the first emission part 310 and the third HTL 332 of the third emission part 330 may be formed of a material having triplet energy level within the same range as that of the EBL 313, thereby maximizing the exciton confinement effect of the first EML 314 or the third EML 334. Alternatively, the first HTL 312 of the first emission part 310 may be formed as the EBL 313, and the third HTL 332 of the third emission part 330 may be formed of a material having triplet energy level (T1) within the same range as that of the EBL 313 of the first emission part 310, thereby further increasing the exciton confinement effect of the first EML 314 and the third EML 334. Accordingly, the whole blue efficiency of the organic light emitting device is enhanced. This will be described below with reference to the following Table 2.

The following Table 2 may show a result which is obtained by measuring the blue efficiency and driving voltage of a comparative example 2, the blue efficiency and driving voltage of an embodiment 3 of the present disclosure, the blue efficiency and driving voltage of an embodiment 4 of the present disclosure, and the blue efficiency and driving voltage of an embodiment 5 of the present disclosure.

TABLE 2

|  | Comparative Example 2 | Embodiment 3 | Embodiment 4 | Embodiment 5 |
|---|---|---|---|---|
| B Efficiency (cd/A) | 2.66 | 2.73 | 2.75 | 2.81 |
| Driving Voltage | 11.6 V | 11.7 V | 11.6 V | 11.6 V |

In the comparative example 2 shown in Table 2, a thickness of the first HTL 312 is 20 nm, a thickness of the EBL 313 is 10 nm, and a thickness of the third HTL 332 is 9 nm. Therefore, a thickness of the first HTL 312 is thicker than that of the EBL 313.

In the embodiment 3, a thickness of the first HTL 312 is 20 nm, a thickness of the EBL 313 is 10 nm, and a thickness of the third HTL 332 is 10 nm.

In the embodiment 4, a thickness of the first HTL 312 is 10 nm, a thickness of the EBL 313 is 20 nm, and a thickness of the third HTL 332 is 20 nm.

In the embodiment 5, the first HTL 312 is not provided, and only the EBL 313 and the third HTL 332 is provided. In this case, a thickness of the EBL 313 is 27 nm, and a thickness of the third HTL 332 is 27 nm. The third HTL 332 is formed of a material having triplet energy level (T1) within the same range as that of the EBL 313.

In the embodiment 3 and the embodiment 4, the triplet energy level (T1) of the first HTL 312 may be based on a material among materials having triplet energy level within a range of 2.2 eV to 2.5 eV, the triplet energy level (T1) of the EBL 313 may be based on a material among materials having triplet energy level of 2.7 eV or more, and triplet energy level (T1) of the third HTL 332 may be based on a material among materials having triplet energy level within a range of 2.4 eV to 2.7 eV. And, in the embodiment 5, triplet energy level (T1) of the EBL 313 may be based on a material among materials having triplet energy level of 2.7 eV or more, and triplet energy level (T1) of the third HTL 332 may be based on a material among materials which has the same triplet energy level (T1) within the same range as that of the EBL 313 and has triplet energy level of 2.7 eV or more.

For example, the first HTL 312 may be expressed as the following Chemical Formula 1, the EBL 313 may be expressed as the following Chemical Formula 2, and the third HTL 332 may be expressed as the following Chemical Formula 3. Alternatively, in the embodiment 5, the third HTL 332 may be expressed as the following Chemical Formula 2. Details of the present disclosure are not limited to Chemical Formula 1, 2 or 3.

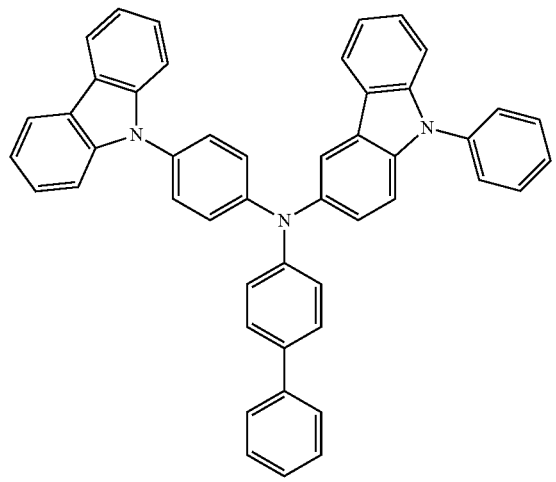

[Chemical Formula 1]

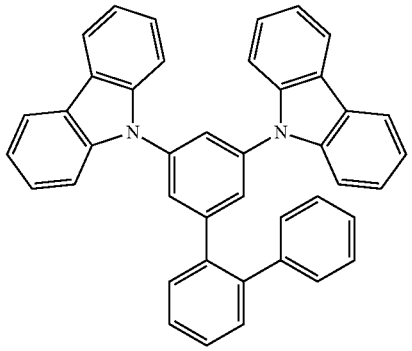

[Chemical Formula 2]

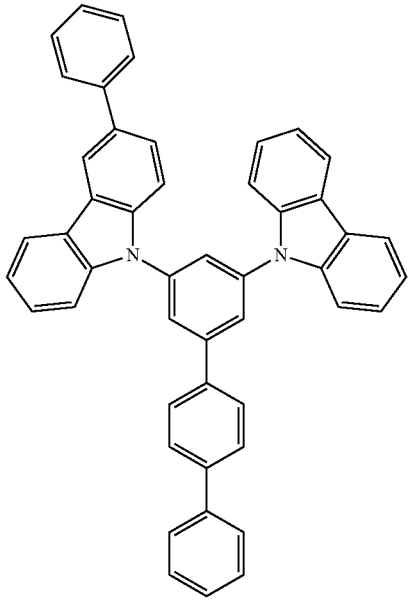

[Chemical Formula 3]

As shown in Table 2, it can be seen that blue efficiency of the comparative example 2 is 2.66 cd/A, blue efficiency of the embodiment 3 is 2.73 cd/A, blue efficiency of the embodiment 4 is 2.75 cd/A, and blue efficiency of the embodiment 5 is 2.81 cd/A.

In the embodiment 3, a thickness of the EBL 313 may be thinner than that of the first HTL 312. Therefore, it can be seen that blue efficiency is further enhanced in the embodiment 3 than the comparative example 2. Accordingly, a thickness of the EBL 313 may be less than that of the first HTL 312, but since the third HTL 332 is formed of a material having triplet energy level (T1) within the same range as that of the EBL 313, it can be seen that blue efficiency is enhanced.

In the embodiment 4, a thickness of the EBL 313 may be thicker than that of the first HTL 312 unlike the comparative example 2. Therefore, it can be seen that blue efficiency is further enhanced in the embodiment 4 than the comparative example 2. Accordingly, since a thickness of the EBL 313 is thicker than that of the first HTL 312 in the embodiment 4 unlike the embodiment 3, it can be seen that blue efficiency is further enhanced in the embodiment 4 than the embodiment 3.

In the embodiment 5, the first HTL 312 may not be provided, the first emission part 310 may be configured with the EBL 313, and the third HTL 332 of the third emission part 330 may be formed of a material having triplet energy level (T1) within the same range as that of the EBL 313. Therefore, it can be seen that blue efficiency is further enhanced in the embodiment 5.

Therefore, when a thickness of the EBL 313 of the first emission part 310 is less than that of the first HTL 312 for enhancing efficiency of the first and third emission layers, the third HTL 332 of the third emission part 330 may be formed of a material having triplet energy level (T1) within the same range as that of the EBL 313, and thus, it can be seen that the exciton confinement effect of the first and third emission parts is maximized, and thus, blue efficiency is enhanced.

Alternatively, a thickness of the EBL 313 of the first emission part is thicker than that of the first HTL 312 for enhancing efficiency of the first and third emission layers, and the third HTL 332 of the third emission part 330 may be formed of a material having triplet energy level (T1) within the same range as that of the EBL 313, and thus, it can be seen that the exciton confinement effect of the first and third emission parts is maximized, and thus, blue efficiency is enhanced.

Alternatively, the first HTL 312 of the first emission part 310 and the third HTL 332 of the third emission part 330 may each be formed of a material having triplet energy level (T1) within the same range as that of the EBL 313 for enhancing efficiency of the first and third emission layers, and thus, it can be seen that the exciton confinement effect of the first and third emission parts is maximized, and thus, blue efficiency is further enhanced.

Moreover, it can be seen that in the driving voltage V, the embodiments 3 to 5 and the comparative example 2 are almost equal. Also, a thickness of the EBL 313 having high triplet energy level may be adjusted to 30 nm or less, and thus, it can be seen that the driving voltage does not increase despite the high triplet energy level.

Therefore, according to the present embodiment, since a thickness of the EBL 313 is greater than that of the first HTL 312 so as to enhance efficiency of the first EML 314, blue efficiency is enhanced. And, according to the present embodiment, a thickness of the EBL 313 may be greater than that of first HTL 312, and the thickness of the EBL 313 is within a particular range that results in enhanced efficiency of the first emission layer 314 in comparison with a conventional EBL having a thickness outside of the particular range.

Alternatively, according to the present embodiment, since a thickness of the EBL 313 is 30 nm or less, provided is an organic light emitting display device in which the driving voltage does not increase despite high triplet energy level.

Alternatively, according to the present embodiment, since triplet energy level of the EBL 313 is greater than that of the first HTL 312, an exciton confinement effect of the first EML 314 increases, thereby enhancing efficiency of the emission layer.

Alternatively, according to the present embodiment, the blue efficiency of the first EML 314 is further enhanced in a case, where a thickness of the first HTL 312 is less than that of the EBL 313, than a case where a thickness of the first HTL 312 is greater than that of the EBL 313.

Alternatively, according to the present embodiment, since the first HTL 312 is formed as the EBL 313, provided is an organic light emitting display device in which even when the EBL 313 is configured to have high triplet energy level, blue efficiency is enhanced without any increase in the driving voltage.

Alternatively, according to the present embodiment, since the first HTL 312 and the EBL 313 are provided as a single layer, one among the first HTL 312 and the EBL 313 may be removed, thereby reducing the manufacturing cost.

Alternatively, according to the present embodiment, since the first HTL 312 and the EBL 313 are formed of the same material, one among the first HTL 312 and the EBL 313 may be removed, thereby reducing the manufacturing cost.

Alternatively, according to the present embodiment, since the EBL 313 having high triplet energy level is disposed adjacent to the first emission layer 314, the exciton confinement effect of the first emission layer 314 increases, and thus, an organic layer having high triplet energy level may not additionally be provided in the first ETL 316. Accordingly, the number of organic layers is reduced, thereby reducing the manufacturing cost.

Alternatively, according to the present embodiment, when a thickness of the EBL 313 of the first emission part 310 is less than that of the first HTL 312, the third HTL 332 of the third emission part 330 may be formed of a material having triplet energy level (T1) within the same range as that of the EBL 313, thereby enhancing blue efficiency.

Alternatively, according to the present embodiment, when a thickness of the EBL 313 of the first emission part 310 is less than that of the first HTL 312, the third HTL 332 of the third emission 330 part may be formed of the same material as that of the EBL 313, thereby enhancing blue efficiency.

Alternatively, according to the present embodiment, a thickness of the EBL 313 of the first emission part may be thicker than that of the first HTL 312, and the third HTL 332 of the third emission part 330 may be formed of a material having triplet energy level (T1) within the same range as that of the EBL 313. Accordingly, the exciton confinement effect of the first EML 314 and the third EML 334 is maximized, thereby enhancing blue efficiency.

Alternatively, according to the present embodiment, a thickness of the EBL 313 of the first emission part 310 may be thicker than that of the first HTL 312, and the third HTL 332 of the third emission part 330 may be formed of the same material as that of the EBL 313. Accordingly, the exciton confinement effect of the first EML 314 and the third EML 334 is maximized, thereby enhancing blue efficiency.

Alternatively, according to the present embodiment, the HTL 312 of the first emission part may be provided as the EBL 313, and the third HTL 332 of the third emission part 330 may be formed of a material having triplet energy level (T1) within the same range as that of the EBL 313 of the first emission part. Accordingly, the exciton confinement effect of the first EML 314 and the third EML 334 is further enhanced, thereby enhancing the whole blue efficiency of the organic light emitting device.

Figure 4:
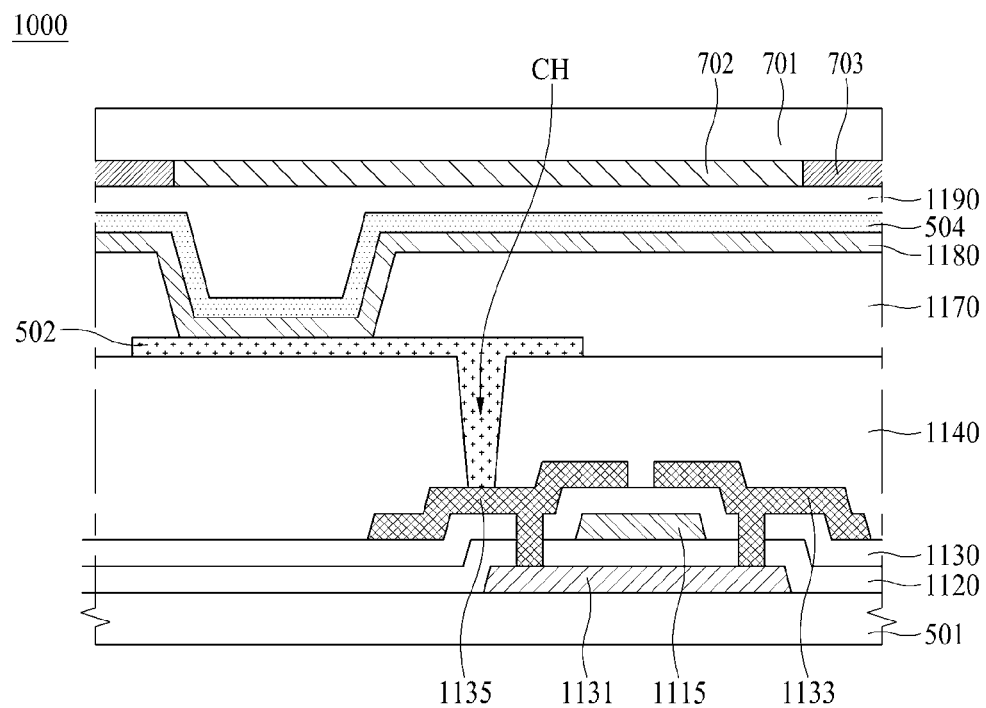
FIG. 4 is a diagram illustrating an organic light emitting device according to another embodiment of the present disclosure.

FIG. 4 is a diagram illustrating an organic light emitting device 1000 according to another embodiment of the present disclosure and illustrates a case where an organic light emitting device according to an embodiment of the present disclosure and another embodiment of the present disclosure is applied.

As illustrated in FIG. 4, the organic light emitting display device 1000 according to another embodiment of the present disclosure may include a substrate 501, a thin film transistor TFT, a first electrode 502, an emission part 1180, and a second electrode 504. The thin film transistor TFT may include an active layer 1131, a gate insulator 1120, a gate electrode 1115, an interlayer dielectric 1130, a source electrode 1133, and a drain electrode 1135.

In FIG. 4, the thin film transistor TFT is illustrated as having a top gate structure, but may be formed in a bottom gate structure.

The substrate 501 may be formed of an insulating material or a material having flexibility. The substrate 501 may be formed of glass, metal, plastic, and/or the like, but is not limited thereto. If an organic light emitting display device is a flexible organic light emitting display device, the substrate 501 may be formed of a flexible material such as plastic and/or the like.

The active layer 1131 may be formed on the substrate 501 and may be formed of amorphous silicon (a-Si), polycrystalline silicon (poly-Si), oxide semiconductor, or organic semiconductor. When the active layer 1131 is formed of oxide semiconductor, the active layer 1131 may be formed of indium tin oxide (ITO), indium zinc oxide (IZO), or indium tin zinc oxide (ITZO), but is not limited thereto.

The gate insulator 1120 may be formed on the active layer 1131 and may be formed of silicon oxide (SiOx), silicon nitride (SiNx), or a multilayer thereof, but is not limited thereto.

The gate electrode 1115 may be formed on the gate insulator 1120 and may be connected to a gate line (not shown). The gate electrode 1115 may include a multilayer formed of one material among molybdenum (Mo), aluminum (Al), chromium (Cr), gold (Au), titanium (Ti), nickel (Ni), neodymium (Nd), copper (Cu), and transparent conductive oxide (TCO) or an alloy thereof, but is not limited thereto.

The interlayer dielectric 1130 may disposed on the gate electrode 1115. The interlayer dielectric 1130 may be formed to cover the gate electrode 1115. The interlayer dielectric 1130 may be formed of an inorganic material. For example, the interlayer dielectric 1130 may be formed of SiOx, SiNx, $Al_2O_3$, and/or the like. Alternatively, the interlayer dielectric 1130 may have a multilayer structure including SiOx and SiNx. However, the present embodiment is not limited thereto.

The source electrode 1133 and the drain electrode 1135 may be disposed on the interlayer dielectric 1130. The source electrode 1133 and the drain electrode 1135 may be electrically connected to the active layer 1131. To provide a detailed description, the drain electrode 1135 may be connected to one end of the active layer 1131 through a contact hole that passes through the gate insulator 1120 and the interlayer dielectric 1130, and the source electrode 1133 may be connected to the other end of the active layer 1131 through another contact hole that passes through the gate insulator 1120 and the interlayer dielectric 1130. The source electrode 1133 and the drain electrode 1135 may each be formed of metal. The source electrode 1133 and the drain electrode 1135 may be formed of the same material as that of a data line. For example, the source electrode 1133 and the drain electrode 1135 may each include molybdenum (Mo), aluminum (Al), chromium (Cr), gold (Au), titanium (Ti), nickel (Ni), neodymium (Nd), copper (Cu), or transparent conductive oxide (TCO) or a stacked structure thereof. However, the present embodiment is not limited thereto.

A passivation layer 1140 may be formed on the source electrode 1133 and the drain electrode 1135, and may be formed of SiOx, SiNx, or a multilayer thereof. Alternatively, the passivation layer 1140 may be formed of an acryl resin or a polyimide resin, but is not limited thereto.

The first electrode 502 is provided on the passivation layer 1140. The first electrode 502 may be formed of gold (Au), silver (Ag), aluminum (Al), molybdenum (Mo), magnesium (Mg), calcium (Ca), lithium fluoride (LiF), Ag—Mg, ITO, or IZO, may be formed of an alloy thereof, or may be formed of a single layer or a multilayer thereof. Alternatively, the first electrode 502 may be formed of ITO, IZO, IGZO, and/or the like, but is not limited thereto. Also, a reflective electrode may be further formed under the first electrode 502 and may reflect light toward the second electrode 504.

The first electrode 502 may be electrically connected to the drain electrode 1135 through a contact hole CH which is formed in a certain area of the passivation layer 1140. In FIG. 4, the drain electrode 1135 is illustrated as being electrically connected to the first electrode 502, but the present embodiment is not limited thereto. As another example, the source electrode 1133 may be electrically connected to the first electrode 502 through the contact hole CH which is formed in the certain area of the passivation layer 1140.

A bank layer 1170 may be formed on passivation layer 1140 and may be formed of an organic material such as a benzocyclobutene (BCB) resin, an acryl resin, or a polyimide resin. However, the present embodiment is not limited thereto.

The emission part 1180 may be formed on the first electrode 502. As illustrated in FIG. 3, the emission part 1180 may include a first emission part, a second emission part, and a third emission part which are disposed on the first electrode 502.

The second electrode 504 may be formed on the emission part 1180. The second electrode 504 may be formed of Au, Ag, Al, Mo, Mg, Li, Ca, LiF, or Ag—Mg which is a metal material, may be formed of ITO, IZO, or indium gallium zinc oxide (IGZO) which is a transparent conductive material such as TCO, or may be formed of a single layer or a multilayer thereof. However, the present embodiment is not limited thereto. Also, a buffer layer may be further formed under the second electrode 504.

An encapsulation layer 1190 may be formed on the second electrode 504. The encapsulation layer 1190 prevents moisture from penetrating into the emission part 1180. The encapsulation layer 1190 may include a plurality of layers where different inorganic materials are stacked, or include a plurality of layers where an inorganic material and an organic material are alternately stacked. Also, an encapsulation substrate 701 may be bonded to the first substrate 501 by the encapsulation layer 1190. The encapsulation substrate 701 may be formed of glass, plastic, or metal. A color filter 702 and a black matrix 703 may be disposed on the encapsulation substrate 701. Light emitted from the emission part 1180 may travel toward the encapsulation substrate 701 and may pass through the color filter 702, thereby displaying an image.

As described above, according to the embodiments of the present disclosure, since a thickness of the EBL is greater than that of the HTL, blue efficiency is enhanced.

Alternatively, according to the embodiments of the present disclosure, since a thickness of the EBL is 30 nm or less, provided is an organic light emitting display device in which a driving voltage does not increase even when the EBL is configured to have high triplet energy level.

Alternatively, according to the embodiments of the present disclosure, since triplet energy level of the EBL is greater than that of the first HTL, an exciton confinement effect of the first EML increases, thereby enhancing efficiency of the emission layer.

Alternatively, according to the embodiments of the present disclosure, since triplet energy level (T1) of the EBL adjacent to the first EML is high, the exciton confinement effect of the emission layer increases, thereby enhancing efficiency of the emission layer.

Alternatively, according to the embodiments of the present disclosure, the blue efficiency of the first EML is further enhanced in a case, where a thickness of the first HTL is less than that of the EBL, than a case where a thickness of the first HTL is greater than that of the EBL.

Alternatively, according to the embodiments of the present disclosure, since the first HTL is formed as the EBL, provided is an organic light emitting display device in which even when the EBL is configured to have high triplet energy level, blue efficiency is enhanced without any increase in the driving voltage.

Alternatively, according to the embodiments of the present disclosure, since the first HTL and the EBL are formed of the same material, one among the first HTL and the EBL may be removed, thereby reducing the manufacturing cost.

Alternatively, according to the embodiments of the present disclosure, a thickness of the first HTL may be thin, and a thickness of the EBL having high triplet energy level may be thick. Accordingly, the exciton confinement effect of the emission layer increases, thereby enhancing the blue efficiency of the first EML.

Alternatively, according to the embodiments of the present disclosure, since the EBL having high triplet energy level is disposed adjacent to the emission layer, the exciton confinement effect of the emission layer increases, and thus, an organic layer having high triplet energy level may not additionally be provided in the first ETL. Accordingly, the number of organic layers is reduced, thereby reducing the manufacturing cost.

Alternatively, according to the embodiments of the present disclosure, when a thickness of the EBL of the first emission part is less than that of the first HTL, the third HTL of the third emission part may be formed of a material having triplet energy level (T1) within the same range as that of the EBL, thereby enhancing blue efficiency.

Alternatively, according to the embodiments of the present disclosure, when a thickness of the EBL of the first emission part is less than that of the first HTL, the third HTL of the third emission part may be formed of the same material as that of the EBL, thereby enhancing blue efficiency.

Alternatively, according to the embodiments of the present disclosure, a thickness of the EBL of the first emission part may be thicker than that of the first HTL, and the third HTL of the third emission part may be formed of a material having triplet energy level (T1) within the same range as that of the EBL. Accordingly, the exciton confinement effect of the first EML and the third EML is maximized, thereby enhancing blue efficiency.

Alternatively, according to the embodiments of the present disclosure, a thickness of the EBL of the first emission part may be thicker than that of the first HTL, and the third HTL of the third emission part may be formed of the same material as that of the EBL. Accordingly, the exciton confinement effect of the first EML and the third EML is maximized, thereby enhancing blue efficiency.

Alternatively, according to the embodiments of the present disclosure, the HTL of the first emission part may be provided as the EBL, and the third HTL of the third emission part may be formed of a material having triplet energy level (T1) within the same range as that of the EBL of the first emission part. Accordingly, the exciton confinement effect of the first EML and the third EML is further enhanced, thereby enhancing the whole blue efficiency of the organic light emitting device.

The details of the present disclosure described in technical problem, technical solution, and advantageous effects do not specify essential features of claims, and thus, the scope of claims is not limited by the details described in detailed description of the disclosure.

It will be apparent to those skilled in the art that various modifications and variations can be made in the present disclosure without departing from the spirit or scope of the disclosure. Thus, it is intended that the present disclosure covers the modifications and variations of this disclosure provided they come within the scope of the appended claims and their equivalents.

What is claimed is:

1. An organic light emitting display device comprising:
   a first emission part between a first electrode and a second electrode, the first emission part including a first hole transport layer and a first emission layer; and
   a second emission part on the first emission part, the second emission part including a second hole transport layer and a second emission layer,
   wherein a thickness of the second hole transport layer is greater than a thickness of the first hole transport layer.

2. The organic light emitting display device of claim 1, wherein the thickness of the first hole transport layer is 20 nm or less.

3. The organic light emitting display device of claim 1, wherein the first emission part further comprises an electron blocking layer.

4. The organic light emitting display device of claim 3, wherein a thickness of the electron blocking layer is greater than the thickness of the first hole transport layer, the thickness of the electron blocking layer being within a particular range that results in enhanced efficiency of the first emission layer in comparison with a conventional electron blocking layer having a thickness outside of the particular range.

5. The organic light emitting display device of claim 3, wherein a sum of the thickness of the first hole transport layer and a thickness of the electron blocking layer is 40 nm or less.

6. The organic light emitting display device of claim 3, wherein the first hole transport layer and the electron blocking layer are formed of a same material.

7. The organic light emitting display device of claim 3, wherein a triplet energy level of the electron blocking layer is within a range of 2.7 eV to 2.9 eV.

8. The organic light emitting display device of claim 3, wherein a triplet energy level of the electron blocking layer is greater than a triplet energy level of the first hole transport layer, and a thickness of the electron blocking layer is 30 nm or less.

9. The organic light emitting display device of claim 3, further comprising: a third emission part on the second emission part, the third emission part including a third hole transport layer and a third emission layer.

10. The organic light emitting display device of claim 9, wherein a thickness of the third hole transport layer is less than a thickness of the second hole transport layer.

11. The organic light emitting display device of claim 9, wherein at least one among the first hole transport layer and the third hole transport layer comprises a material having a triplet energy level within a same range as a range of a triplet energy level of the electron blocking layer.

12. The organic light emitting display device of claim 9, wherein when the third hole transport layer includes a material having a triplet energy level within a same range as a range of a triplet energy level of the electron blocking layer of the first emission part, a thickness of the electron blocking layer in the first emission part is less than the thickness of the first hole transport layer.

13. The organic light emitting display device of claim 9, wherein at least one among the first emission layer and the third emission layer includes one among a blue emission layer, a deep blue emission layer, and a sky blue emission layer.

14. The organic light emitting display device of claim 1, wherein at least one among the first electrode and the second electrode is a semitransmissive electrode.

15. An organic light emitting display device comprising:
a first emission part between a first electrode and a second electrode, the first emission part including a first hole transport layer, an electron blocking layer, and a first emission layer; and
a second emission part on the first emission part, the second emission part including a second hole transport layer and a second emission layer,
wherein a thickness of the first hole transport layer is less than a thickness of the electron blocking layer.

16. The organic light emitting display device of claim 15, wherein a sum of the thickness of the first hole transport layer and the thickness of the electron blocking layer is 40 nm or less.

17. The organic light emitting display device of claim 15, wherein a triplet energy level of the electron blocking layer is higher than a triplet energy level of the first hole transport layer.

18. The organic light emitting display device of claim 15, wherein the first hole transport layer and the electron blocking layer are formed of a same material.

19. The organic light emitting display device of claim 15, further comprising: a third emission part on the second emission part, the third emission part including a third hole transport layer and a third emission layer.

20. The organic light emitting display device of claim 19, wherein at least one among the first hole transport layer and the third hole transport layer comprises a material having a triplet energy level within a same range as a range of a triplet energy level of the electron blocking layer.

21. The organic light emitting display device of claim 19, wherein at least one among the first emission layer and the third emission layer inludes one among a blue emission layer a deep blue emission layer, and a sky blue emission layer.

22. The organic light emitting display device of claim 19, wherein a thickness of the third hole transport layer is less than a thickness of the second hole transport layer.

23. The organic light emitting display device of claim 15, wherein a thickness of the second hole transport layer is greater than the thickness of the first hole transport layer.

24. The organic light emitting display device of claim 15, wherein at least one among the first electrode and the second is a semitransmissive electrode.

\* \* \* \* \*